(12) United States Patent
Nakamura

(10) Patent No.: US 6,783,998 B2
(45) Date of Patent: Aug. 31, 2004

(54) CONDUCTIVE THIN FILM, A CAPACITOR USING THE SAME AND A METHOD OF MANUFACTURING THEREOF

(75) Inventor: Takashi Nakamura, Ukyo-ku (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/393,443

(22) Filed: Mar. 20, 2003

(65) Prior Publication Data

US 2003/0232453 A1 Dec. 18, 2003

Related U.S. Application Data

(60) Continuation of application No. 09/610,193, filed on Jul. 5, 2000, now abandoned, which is a division of application No. 09/200,315, filed on Nov. 25, 1998, now abandoned.

(30) Foreign Application Priority Data

Nov. 28, 1997 (JP) ............................................. 9-326850

(51) Int. Cl.⁷ ...................... H01L 21/00; H01L 21/8242
(52) U.S. Cl. .......................... 438/3; 438/240; 438/253; 438/396; 257/295; 257/303; 257/310
(58) Field of Search ............................. 438/3, 250–256, 438/393–399, 240; 257/295–296, 303–311

(56) References Cited

U.S. PATENT DOCUMENTS

| | | | |
|---|---|---|---|
| 5,348,894 A | 9/1994 | Gnade et al. | |
| 5,471,364 A | 11/1995 | Summerfelt et al. | |
| 5,492,855 A | 2/1996 | Matsumoto et al. | |
| 5,566,045 A | 10/1996 | Summerfelt et al. | |
| 5,622,893 A | 4/1997 | Summerfelt et al. | |
| 6,037,264 A | 3/2000 | Hwang | |
| 6,087,265 A | 7/2000 | Hwang | |
| 6,171,970 B1 | 1/2001 | Xing et al. | |
| 6,187,622 B1 * | 2/2001 | Kuroiwa et al. | ............ 438/240 |
| 6,201,271 B1 | 3/2001 | Okutoh et al. | |
| 6,454,956 B1 * | 9/2002 | Engelhardt et al. | ........... 216/53 |
| 6,536,449 B1 * | 3/2003 | Ranft et al. | .................. 134/1.1 |

FOREIGN PATENT DOCUMENTS

| JP | 08-250660 | | 9/1996 | |
|---|---|---|---|---|
| JP | 2000021859 A | * | 1/2000 | ....... H01L/21/3065 |

* cited by examiner

Primary Examiner—John F. Niebling
Assistant Examiner—Jennifer M. Kennedy
(74) Attorney, Agent, or Firm—Merchant & Gould P.C.

(57) ABSTRACT

It is an object of the present invention to provide a capacitor and a method of manufacturing the same having an electrode made of material(s) capable of carrying a fine work through etching while withstanding a high temperature thermal treatment for crystallizing dielectric materials such as ferroelectric materials and the like. The capacitor comprises a dielectric material composed by using at least a ferroelectric material or a high-dielectric material, and an electrode composed by using a material containing a noble metal, the electrode being formed on at least one side of the dielectric material, and the material of the electrode contains rhenium (Re). The capacitor is fabricated by patterning the material of the electrode contains rhenium (Re) using dry-etching method by introducing either of fluorine gas or chlorine gas.

13 Claims, 2 Drawing Sheets

US 6,783,998 B2

CONDUCTIVE THIN FILM, A CAPACITOR USING THE SAME AND A METHOD OF MANUFACTURING THEREOF

CROSS-REFERENCE TO RELATED APPLICATION

The entire disclosure of Japanese Patent Application No. Hei 9-326850 filed on Nov. 28, 1997 including specification, claims, drawings and summary is incorporated herein by reference in its entirety.

BACKGROUND OF INVENTION

1. Field of the Invention

This invention relates to a conductive thin film, a capacitor using ferroelectric materials, high dielectric materials and a method of manufacturing thereof, more specifically the conductive thin film to be easily patterned by etching, the capacitor having electrode materials to be easily patterned by etching while easily forming layers with ferroelectric materials or high dielectric materials, and a method of manufacturing such capacitor.

2. Description of the Related Art

Ferroelectric materials such as PZT ($Pb(Zr, Ti) O_3$) or SBT ($SrBi_2 Ta_2O_9$) are used to manufacture capacitors that configure ferroelectric memories. Also, dielectric materials such as BST (($Ba, Sr) TiO_3$) and the like having a high dielectric constant in permanent dielectric substances are used to manufacture capacitors that configure dynamic random access memories (DRAMs). Annealing in an oxidation atmosphere at a range of 650 to 850° C. is required to crystalize these dielectric materials after forming layers with the materials. Further, matching in lattice constant with that of adjacent materials composing electrodes is required in order to crystalize a layer(s) formed with the ferroelectric materials. In consideration of above-mentioned requirements, either of platinum (Pt), iridium (Ir) or an alloy of these metals having a stability in a high temperature as well as having similar lattice constant to the ferroelectric materials is used for configuring an electrode of the capacitors in above. Also, oxides of noble metals such as $IrO_2$, $RuO_2$, $RhO_2$, $RhO_3$, $PtO_2$, $OsO_2$ and the like are used for the electrode by itself or as part of a multi-layer composed with any of above-mentioned metals because of their conductivities.

As described above, not much oxidation disturbing crystallization and/or conductivity during the annealing for the crystallization is caused by using platinum (Pt), iridium (Ir) or an alloy of these for electrode as electrode materials, so that the any of these is suitable for the electrode of the capacitors in above. The electrode made of these materials, however, is formed by carrying out patterning with etching using a mask 23, after disposing a metal layer 22 so as to cover the surface of a substrate 21 as shown in FIG. 2(a). The noble metals Pt and/or iridium used for the electrode are well-stabilized in a chemical stand-point, so that no chemical etching can be carried out on these metals. In order to carrying out etching, a method called sputtering in which the metals(s) are physically removed such as with ion milling using an inactive gas (Ar or the like) by emitting ions need to be carried out. By carrying out such etching, molecular of the metal(s) to be etched, that of the metal(s) used for the electrodes themselves are flown out from the metal(s). The molecular adhere on surfaces to be etched of the metal layer 22 as well as both sides of the mask 23 as burrs 22a (side walls) as shown in FIG. 2(b). The burrs 22a thus adhere can not be removed by reaction because the burrs 22a are just composed of fine grains of platinum, iridium or the alloy of these metals. The side walls 22a remain as they are even when the mask 23 (photo resist layer) is completely removed as shown in FIG. 2(c). Consequently, this etching method can not be applied to the parts where requiring a fine work. The drawback is observed not only the noble metals themselves such as Pt, Ir, but also observed when oxides of the noble metals having conductivity such as one of $IrO_2$, $RuO_2$ is used.

Although, further improvements in etching so as to finish the electrode without forming side walls are required as a result of the recent trend in high-integration of semiconductor memory and the like, the conventional etching for making electrodes disturbs the improvements. Degradation of the characteristics of capacitors is arisen when the physical etching is carried out as a result of causing damage(s) on the surface to be etched of dielectric substances.

SUMMARY OF THE INVENTION

It is an object of the present invention to overcome the above mentioned drawbacks on the capacitors, and to provide a capacitor and a method of manufacturing the same having an electrode made of material(s) capable of carrying a fine work through etching while withstanding a high temperature thermal treatment for crystallizing dielectric materials such as ferroelectric materials and the like. It is another object of the present invention to provide a conductive thin film and a method of manufacturing a semiconductor device having the thin film made of material(s) capable of carrying a fine work through etching while withstanding a high temperature thermal treatment.

In accordance with characteristics of the present invention, there is provided a capacitor comprises a dielectric material composed by using at least one of a ferroelectric material and a high-dielectric material, and an electrode composed by using a material containing a noble metal, the electrode being formed on at least one side of the dielectric material, and wherein the material of the electrode contains rhenium (Re).

Here, the noble metal is defined as metals having stable characteristics in thermally and chemically, as well as having excellent electric conductivities, including gold (Au), platinum (Pt), iridium (Ir), osmium (Os), silver (Ag), palladium (Pd), rhodium (Rh) and ruthenium (Ru).

Moreover, the capacitor means not only a capacitor holding a ferroelectric layer between metal layers disposed therein, but also means semiconductors having an FET (field effect transistor) structure including a capacitor, in other words the semiconductor device having an MFS structure or similar structure in which both a ferroelectric layer and a gate electrode are formed in that order on a channel region located in a semiconductor substrate.

By constructing the capacitor in that structure, Re may be liberated at a relatively low temperature by combining with fluorine and/or chlorine and so on. Therefore, Pt and/or Ir existed adjacent to the liberated Re may also be liberated easily when Re existing in crystalline structures of Pt and/or Ir are liberated. In this way, reactive etching, not physical etching can be performed to noble metals.

The material containing a noble metal can be Pt and/or Ir, may also one oxide of a metal selected from a group of osmium (Os), iridium (Ir), platinum (Pt), ruthenium (Ru) and rhodium (Rh). Further, the electrode has a multi-layered structure made of a conductive material, and at least one of the layers forming the multi-layered structure contains the material containing a noble metal, and the one layer may contains rhenium (Re).

In accordance with characteristics of the present invention, there is provided a semiconductor device including a capacitor structure at least comprises a semiconductor layer, a dielectric material composed by using at least one of a ferroelectric material and a high-dielectric material located on the semiconductor layer, and an electrode formed on the dielectric material, wherein a material containing a noble metal adding rhenium (Re) is used for a material of the thin film.

Also, in accordance with characteristics of the present invention, there is provided a method of manufacturing a capacitor comprises the steps of forming an electrode composed by using a material containing a noble metal at least one side of a dielectric material composed by using at least one of a ferroelectric material and a high-dielectric material, and performing a patterning of the electrode by etching, wherein rhenium (Re) is added to the material of the thin film, and wherein the etching is in dry-etching by introducing either of fluorine gas or chlorine gas.

It is preferable to carry out etching with supplying the supply source for causing oxidation when dry-etching is carried out by introducing the chlorine gas. Because, Re can be liberated more easily as an oxygen chlorine. ($ReClO_3$, $ReCl_4$ O) as a result of sufficient supply of oxygen.

Further, in accordance with characteristics of the present invention, there is provided a thin film having a certain conductivity, the thin film being composed by using a material containing a noble metal, wherein the material contains Re.

In accordance with characteristics of the present invention, there is provided a semiconductor device comprises a semiconductor substrate, and a conductive thin film formed one of directly and indirectly on the substrate, wherein a material containing a noble metal adding rhenium (Re) is used for a material of the thin film.

Also, in accordance with characteristics of the present invention, there is provided a method of manufacturing a semiconductor device comprises the steps of forming a conductive thin film on a semiconductor substrate one of directly and indirectly, performing a patterning of the conductive thin film by etching, wherein a material of the thin film is made by using a material containing a noble metal adding rhenium (Re), and wherein the etching is in dry-etching by introducing fluorine gas.

Further, in accordance with characteristics of the present invention, there is provided a method of manufacturing a semiconductor device comprises the steps of forming a conductive thin film on a semiconductor substrate one of directly and indirectly, and performing a patterning of the conductive thin film by etching, wherein a material of the thin film is made by using a material containing a noble metal adding rhenium (Re), and wherein the etching is in dry-etching by introducing chlorine gas.

While the novel features of the invention are set forth in a general fashion, both as to organization and content, the invention will be better understood and appreciated, along with other objects and features thereof from the following detailed description taken in conjunction with the drawings.

DETAILED DESCRIPTION OF THE PREFERRED EMBODIMENT

An embodiment of a conductive thin film according to the present invention will be described hereunder in the case of using the thin film to a capacitor having one of ferroelectric and high dielectric constant materials.

Thorough studies and researches are conducted to investigate a material which satisfies no adhesion of the fine grains of the etched-material on that surfaces when patterning is carried out to the electrode of the capacitor having one of the ferroelectric and the high dielectric constant materials while no adverse effect is given to crystalize dielectrics such as ferroelectric materials and the like. As a result of the studies and the researches, the inventor has found out that Re may easily be evaporated at a relatively low temperature as a result of a chemical reaction caused with one of fluorine gas and chlorine gas while maintaining its stability without causing oxidization at a high temperature. And the inventor further found out that an alloy of Re, Pt and/or Ir both have been used has better characteristics in etching without damaging crystallinity of the dielectric materials.

Figure 1A:
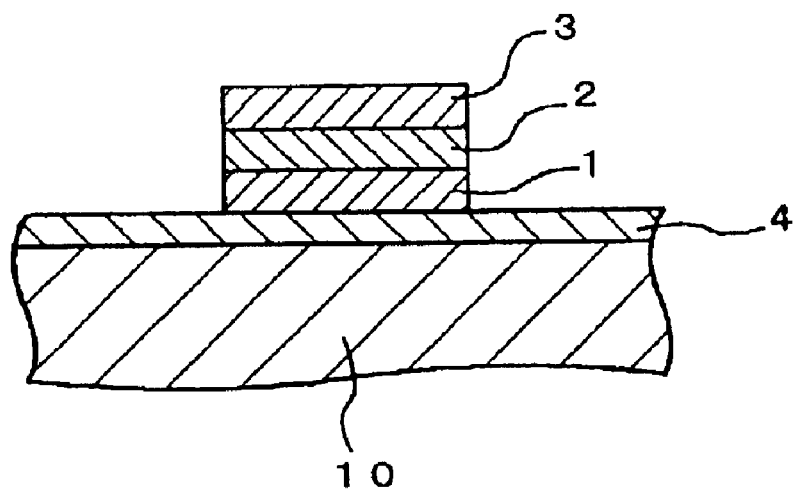
FIG. 1(a) is a cross sectional view illustrating structure of a capacitor composed in accordance with an embodiment of the present invention.
Figure 1B:
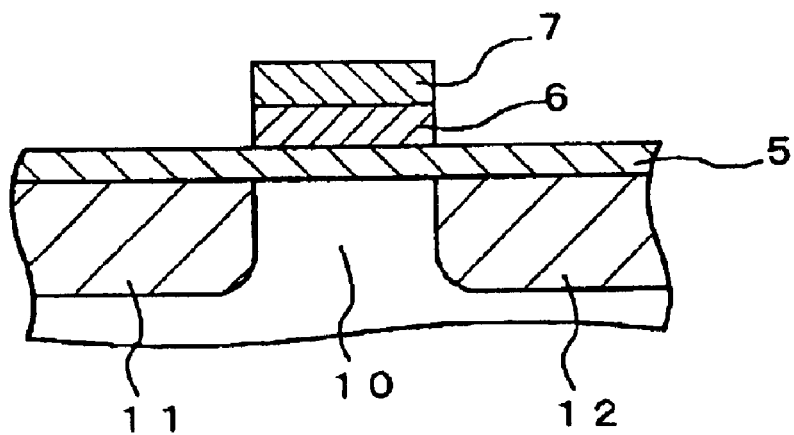
FIG. 1(b) is a cross sectional view illustrating structure of a capacitor composed in accordance with another embodiment of the present invention.
Figure 2A:
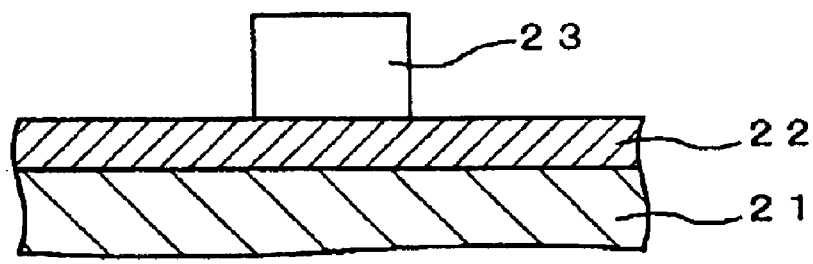
FIG. 2(a) is a sectional view illustrating the electrode for describing the drawbacks associated with the prior art materials.
Figure 2B:
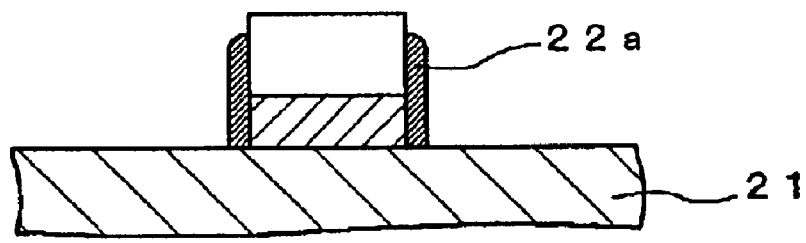
FIG. 2(b) is another sectional view illustrating the electrode for describing the drawbacks associated with the prior art materials.
Figure 2C:
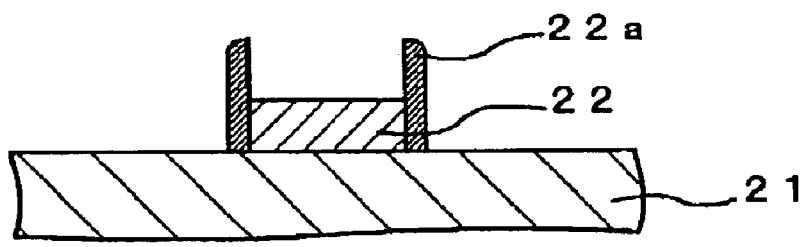
FIG. 2(c) is far another sectional view illustrating the electrode for describing the drawbacks associated with the prior art materials.

The capacitor is generally structured by forming each of a lower electrode 1 on a semiconductor substrate 10 through an insulation layer 4 and the like, a dielectric layer 2 made of dielectric material(s) located on the lower electrode 1, and an upper electrode layer 3 positioned above the dielectric layer 2, and then carrying out patterning to a part of the layers as shown in FIG. 1(a). The patterning can be carried out in several different ways such as carrying out to the lower electrode 1, the dielectric layer 2 and the upper electrode layer 3 simultaneously, or carrying out only to the lower electrode 1 and then both the dielectric layer 2 and the upper electrode layer 3 simultaneously, or carrying out all the layers independently. Further, there are another type of capacitor such as a ferroelectric memory FET (field effect transistor) having a structure so called MFIS structure and another structure called MFS structure. The capacitor having the MFIS structure comprises a ferroelectric layer 6 made of ferroelectric material(s) positioned on the semiconductor substrate 10 through a gate oxidation layer 5, and a gate electrode 7 formed on the ferroelectric layer 6 as depicted in FIG. 1(b). The capacitor having the MFS structure is fabricated by forming the ferroelectric layer directly on the semiconductor layer. Both the MFIS structure and the MFS structure can also be defined as a semiconductor device including a capacitor structure.

Thermal treatment in an oxidation atmosphere at a range of 650 to 850° C. in 1 to 60 minutes is carried out after forming the layers when the ferroelectric used for the ferroelectric memory FETs or the high dielectric material(s) used for the DRAMs such as PZT (Pb(Zr, Ti) $O_3$ or SBT ($SrBi_2Ta_2O_9$) are used for the ferroelectric layers 2, 6. Occurrence of degradation of electric characteristics and damage of crystallinity is observed when the electrodes 1, 3 and 7 are oxidized during the thermal treatment because nonconductive oxides are formed on the surfaces thereof. In order to avoid such phenomena, the material unchanging its properties after carrying out the thermal treatment is required, so that noble metals such as Pt and/or iridium or oxides of noble metals such as $IrO_2$, $RuO_2$ and the like are used for forming the electrode.

The present invention is characterized in that Re is added to the electrode materials. For example, an electrode made of Pt and/or Ir including Re may be formed by carrying out sputtering using a target made of an alloy of Pt and Re, or a target made of an alloy of Ir and Re or the like, or by carrying out sputtering using both the target made of the Pt or the like, and the target made of Re while rotating both the targets. The ratio of Re to the whole material(s) may be determined by the numbers of targets made of Re in all the targets. An electrode made of oxides of noble metal including Re can be formed by carrying out sputtering using a target made of oxides of an alloy including Re, or by carrying out sputtering in an oxidation atmosphere using the target made of the alloy including Re, or using both the target made of Ir and the target made of Re when Re is added to $IrO_2$.

Next, the details of a conclusion that the addition of Re to the material(s) for forming the electrode including noble metals increases characteristics of the electrode as well as facilitate etching will be described hereunder. As described earlier, the materials for forming the electrode need to withstand a high temperature thermal treatment carried out in an oxidation atmosphere. Only a certain kinds of metals withstand against the high temperature thermal treatment in an oxidation atmosphere. Table 1 shows reactions of several metals which are know as (noble) metals relatively hard to oxidize in the high temperature thermal treatment carried out in the oxidation atmosphere. As shown in the table 1, Ir, Pt, Au, Ag, Pd and Re are recognized as metals withstand in the high temperature thermal treatment in the oxidation atmosphere for crystallizing the ferroelectrics.

TABLE 1

REACTION OF SEVERAL NOBLE METALS IN AN OXIDATION ATOMOSPHERE

| ELEMENTS | INITIAL TEMPERATURE OF OXIDATION | OXIDE FORMED | REMARKS |
|---|---|---|---|
| Os | 200~400° C. | $OsO_4$ | MOST EASY ELEMENT TO BE OXIDIZED IN PLATINUM GROUP |
| Ir | >800° C. | $IrO_2$ | VAPORIZED AT A TEMPERATURE GREATER THAN 1000° C. |
| Pt | NONE | | NOT OXDIZED IN AN OXIDATION ATMOSPHERE |
| Au | NONE | — | NOT OXDIZED IN AN OXIDATION ATMOSPHERE |
| Ru | >700° C. | $RuO_2$ | VOLATALIZD WITH FORMATION OF $RuO_4$ |
| Rh | 600° C. | $Rh_2O_3$ | GRADUALLY OXIDIZED. THEN DECOMPOSED AT A HIGHER TEMPERATURE |
| Pd | >820° C. | PdO | DECOMPOSED AT A HIGHER TEMPERATURE |
| Ag | NONE | | $Ag_2O_2$ IS FORMED IN AN $O_3$ ATOMOSPHERE |
| Re | >1000° C. | $Re_2O_7$ | OXIDIZED ON SURFACE AT ROOM TEMPERATURE IN AMBIENT AIR |

Next, a consideration is given to materials for carrying out dry-etching. As described earlier, the burrs (side walls) are remained as well as causing damage(s) on the surface to be etched of dielectric substances in the dry-etching carried out using inactive gas such as Ar and the like. In order to avoid such phenomena, dry-etching using either of halogen or halogen compound (both halogen and halogen compound are hereinafter referred to as halogens) will be described hereunder as an example. The required factors of the metals used in the dry-etching using the halogens are of reacting with the halogens at a low temperature, and having a low melting point and a low boiling point of halogen compound formed during the etching.

Concerning the reaction of the metals with the halogens, most of the (noble) metals listed above which might withstand against the high temperature thermal treatment in the oxidation atmosphere react with the halogens only at a high temperature. Therefore, most of the metals listed above need to be etched physically because not much reaction proceeds during the etching than it should be at a low pressure. On the contrary, only Re reacts with fluoride (F) at a low temperature. In addition, dry-etching can not be carried out in the case that the resulting products can not be vaporized even when the metals react with the halogens. Table 2 shows the melting points and the boiling points of the halogen compound of the above-listed metals.

TABLE 2

MELTING POINTS AND BOILING POINTS OF HALOGEN COMPOUNDS OF MAJOR METALS

| ELEMENTS | MELTING POINTS (° C.) | BOILING POINTS (° C.) | ELEMENTS | MELTING POINTS (° C.) | BOILING POINTS (° C.) |
|---|---|---|---|---|---|
| $PtF_6$ | 61.3 | 69.1 | AuCl | | 170(DECOMPOSED) →$AuCl_3$ |
| $PtCl_2$ | | 581(DECOMPOSED) | $AuCl_3$ | | 200(SUBLIMATED IN $Cl_2$) |

TABLE 2-continued

MELTING POINTS AND BOILING POINTS OF
HALOGEN COMPOUNDS OF MAJOR METALS

| ELEMENTS | MELTING POINTS (° C.) | BOILING POINTS (° C.) | ELEMENTS | MELTING POINTS (° C.) | BOILING POINTS (° C.) |
|---|---|---|---|---|---|
| $PtCl_4$ | | 370(DECOMPOSED) | AuBr | | 115(DECOMPOSED) |
| $PtBr_2$ | | 250(DECOMPOSED) | $AuBr_3$ | 97.5 | 160(DECOMPOSED) |
| $PtBr_4$ | | 180(DECOMPOSED) | $Ag_2F$ | | 90(DECOMPOSED) |
| $PtI_2$ | | 325(DECOMPOSED) | AgF | 435 | 1150(DECOMPOSED) |
| $IrF_3$ | | 250(DECOMPOSED) | $AgF_2$ | 690 | 700(DECOMPOSED) |
| $IrF_5$ | 104.5 | | AgCl | 455 | 1550 |
| $IrF_6$ | 44.4 | 53 | $AgClO_3$ | 230 | 270(DECOMPOSED) |
| $IrCl_3$ | | 763(DECOMPOSED) | $AgClO_4$ | POSED) | 486(DECOMPOSED) |
| $ReF_4$ | 124.5 | 795 | AgBr | 432 | >1300(DECOMPOSED) |
| $ReF_6$ | 18.7 | 33.8 | $PdF_2$ | | |
| $ReF_7$ | 48.3 | 73.7 | $PdCl_2$ | 678 | >680(DECOMPOSED) |
| $ReCl_3$ | | >550 | $PdBr_2$ | | |
| $ReCl_5$ | 220 | | $PdI_2$ | | 105(DECOMPOSED) |
| $ReBr_3$ | | >500 | | | |
| $ReCl_4O$ | 29.3 | 223 | | | |
| $ReClO_3$ | 4.5 | 131 | | | |

As apparent from the table 2, most of the compounds either show high melting points and high boiling points or to be decomposed. The high melting points and high boiling points cause adhesion of unvaporized solid and/or liquid on both sides of the mask and adjacent thereof even when the metals react with the halogens during the etching. In the same way, the decomposition causes adhesion of decomposed noble metals on the both sides and so on. Both the melting point and the boiling points of the compound of $ReF_6$ are remarkably low. Reactive etching may be expected during the etching because Re may easily reacts with fluorine gas as described earlier. No adhesion on the both sides of the mask and so on is observed because the compound $ReF_6$ formed from Re through the etching is vaporized due to its low boiling point. Similarly, Vaporization of hexa-fluoride compound made of Ir and Pt can be performed in an atmosphere carrying out dry-etching at a low pressure because the boiling point of the hexa-fluoride compound is relatively low. On the other hand, it is hard to carry out reactive dry-etching because reactivity of Ir and/or Pt with the fluoride gas is quite low and both the metals form fluorides only at a high temperature atmosphere.

In the present invention, reactive dry-etching can be carried out as a result of accelerating the reaction between Ir and/or Pt and fluorides by utilizing a high reactivity between Re and fluoride gas. In other words, the reactivity of Ir and/or Pt with the fluoride gas is increased by replacing a part of the electrode made of Ir and/or Pt with Re while observing no adhesion and formation of no side walls (burrs adheres on the surfaces to be etched) because the compositions formed by the reaction such as $Pt_x Re_{1-x} F_6$ and/or $Ir_x Re_{1-x} F_6$ can be vaporized as a result of their low boiling point.

The advantage described above can be expected not only in the use of fluoride gas, but also in the use of chlorine gas. There is a probability that chlorine compound formed during the etching possibly adheres on the both sides of the mask without vaporizing because both the melting point and the boiling point of chlorine are high. However, both the melting point and the boiling point of oxygen chloride of Re are relatively low, so that it can be vaporized under a low pressure. In other words, the similar advantage to that of the reactive dry-etching carried out using the fluoride gas described earlier can be expected by using chlorine gas as an etchant in an atmosphere with the presence of oxygen. Oxide gas such as oxygen gas, ozone, $NO_x$ can be used as a supply source for causing oxidation, and these should be added to the etchant. The atmosphere with the presence of oxygen can be created by utilizing a mask made of photo resist or $SiO_2$ both containing oxygen without supply of oxide gas.

Moreover, table 3 shows conductive metal oxides having enough conductivity capable of using for the electrode of the ferroelectric capacitor described earlier. As apparent from the table 3, the metal oxides which withstand the thermal treatment for the crystallization are $IrO_2$, $RuO_2$, $RhO_2$, $RhO_3$ and $ReO_2$.

TABLE 3

CONDUCTIVE METAL OXIDES OF NOBLE METALS

| | CRYSTALLINE SYSTEM | LATTICE CONSTANT Å | MELTING POINTS (° C.) | ELECTRIC RESISTANCE (Ω/cm) | REMARKS |
|---|---|---|---|---|---|
| $OsO_2$ | TETRAGONAL | a = 4.51, c = 3.19 | 500(D) | 6.0E−5 | FORMING $OsO_4$ AFTER DECOMPOSITION |
| $IrO_2$ | TETRAGONAL (RUTILE) | a = 4.498, c = 3.154 | 1100 | 4.9E−5 | |
| $PtO_2$ | TETRAGONAL | | 450, 500(D) | 6.0E−4 | NO PERFECT ANRYDROUS |
| $RuO_2$ | TETRAGONAL (RUTILE) | a = 4.51, c = 3.11 | | 3.5E−5 | |
| $RhO_2$ | TETRAGONAL (RUTILE) | a = 4.486, c = 3.088 | | <1E−4 | |
| $RhO_3$ | CUBIC | | | 1.8E−5 | |
| $ReO_2$ (β) | MONOCLINIC | | 1000(D) | 1.0E−4 | FORMING $Re_2O_7$ AFTER DECOMPOSITION |
| $ReO_3$ | CUBIC | a = 3.74 | 400(D) | 1.8E−5 | FORMING $ReO_2$ AFTER DECOMPOSITION |

(D): DECOMPOSITION TEMPERATURE

Another consideration is given to materials for carrying out dry-etching. Similar to the earlier embodiment, the required factors of the conductive metal oxides used in the dry-etching using the halogens are both of reacting with the halogens at a low temperature, and having a low melting point and a low boiling point of halogen compound formed during the etching. Both Re and Ru react with fluoride (F) at a low temperature as far as concerning the reactivity to the halogens. However, RU could take different valence number, ions of Ru except for tetra-valent ions are generated at a high temperature. The ions thus generated cause degradation, of the capacitor characteristics because the ions react with the ferroelectric materials as a result of high reactivity thereof. On the contrary, $ReO_3$ having hexa-valent of Re oxides is decomposed at approximately 400° C. and becomes to $ReO_2$. Re oxide having tetra-valent has been kept stable until generation of $Re_2O_7$ as a result of decomposition of $ReO_2$ started at approximately 1,000° C.

Table 4 shows the melting points and the boiling points of compounds generated as a result of reaction to the halogen, the compounds shown in the table are not listed on the table 2.

TABLE 4

MELTING POINTS AND BOILING POINTS OF HALOGEN COMPOUNDS OF MAJOR METALS

| ELEMENTS | MELTING POINTS (° C.) | BOILING POINTS (° C.) | ELEMENTS | MELTING POINTS (° C.) | BOILING POINTS (° C.) |
|---|---|---|---|---|---|
| $RhF_3$ | | >600 (SUBLIMATED) | $OsF_4$ | 230 | |
| $RhF_5$ | 95.5 | | $OsF_5$ | 70 | 225.7 |
| $RhF_6$ | 70 | DECOMPOSED | $OsF_6$ | 32.1 | 45.9 |
| $RhCl_3$ | | 450 (DECOMPOSED) | $OsCl_3$ | 350 (SUBLIMATED) | 450 (DECOMPOSED) |
| $RhBr_3$ | | DECOMPOSED | $OsCl_4$ | | 450 |
| | | | $OsBr_4$ | | 350 (DECOMPOSED) |
| | | | $OsF_2O_3$ | 171 | |

As apparent from the table 4, both the melting point and the boiling point of compounds including Rh are too high, or Rh is in decomposition, and hexa-fluoride of Os can be vaporized during the dry-etching carried out under a low pressure because the boiling point of hexa-fluoride of Os is relatively low. However, it is hard to carry out reactive dry-etching because reactivity of Os with the fluoride gas is quite low and Os forms fluorides only at a high temperature atmosphere. Therefore, the conductive oxides described above capable of using for the dry-etching are formed by replacing a part of the oxidized electrode made of $IrO_2$ and the like with Re similar to the metals described earlier. In this way, the reactivity of the oxidized electrode can be increased by utilizing a high reactivity of Re to the fluoride gas. Further, substances formed by the reaction such as $Ir_x Re_{1-x} F_6$ and the like can be vaporized at a low temperature as a result of their low boiling point. Consequently, no adhesion and the formation of no side walls are observed. Further, the oxygen chloride of Re can be vaporized under a low pressure similar to the embodiment described above, so that the dry-etching can be carried out by using the chlorine gas. No introduction of oxide gas is needed to carry out the etching because the electrode is composed of materials containing oxides. Therefore, reactive dry-etching not allowing any adherence on both sides of the mask and the like can be carried out by replacing a part of the electrode with Re having an excellent anti-acid characteristic when the oxide of the noble metals having conductivity such as $IrO_2$ is used for the electrode.

As described earlier, thorough studies and researches are conducted to investigate a material which is not oxidized during the high temperature thermal treatment for crystallizing dielectric materials carried out in the atmosphere with the presence of oxygen, as well as a material capable of using for carrying out reactive dry-etching. As a result of the study and the researches, the inventor has found out that the addition of Re to the electrode materials containing noble metals such as Pt, Ir, $IrO_2$ and the like make the electrode so as to withstand during the high temperature thermal treatment, and capable of carrying out reactive dry-etching as well as capable of carrying out a fine work on. In other words, Re itself is liberated as a halogenoid by carrying out dry-etching using halogen gas as an etchant because Re existing in the electrode may be vaporized when it reacts with halogen. Halogen combines to the places where no Re is existed as a result of the lack of Re caused by the evaporation. Then, Pt and/or Ir bonded with halogen liberates therefrom. Reactive dry-etching can be carried out by repeating a series of process described hereinabove. Although, a certain amount of Re added to the electrode is acceptable because of its heat resistance, the amount of Re is preferably not too much in consideration of alignment to the crystal of ferroelectrics. Because Pt and/or Ir has better probability of aligning to the crystalline of ferroelectrics and the like than that of Re. Though, the more Re is preferable in an ordinary active etching, only a small amount of Re enables the reactive dry-etching since Re tend to cause a chain reaction as described earlier. The amount of Re added to the electrode is preferably at a range of 5 to 20 atomic percentage in consideration of above-mentioned conditions.

According to the present invention, the electrode holding either of ferroelectric material(s) or high-dielectric material (s) in its inside is made of Pt and/or Ir, or the conductive oxides containing Re, so that, reactive etching, not physical etching can be performed to noble metals such as Pr and/or Ir by carrying out dry-etching using either fluoride gas or chlorine gas as an etchant. Consequently, the noble metals thus removed not adhere on the surfaces to be etched and adjacent thereof, so that, a fine work can be performed. Moreover, no degradation of Re is observed when a high temperature thermal treatment for crystallizing dielectric materials is carried out because Re has enough heat resistance similar to that of Pt and Ir. In this way, a high-performance capacitor composed of ferroelectrics and/or high dielectrics can be realized.

Although, the conductive thin film is used as a part of the electrode of the capacitor made of ferroelectrics and/or high dielectrics in the embodiment described above, the conductive thin film according to the present invention can also be used as other electrodes commonly used.

Further, the conductive thin film according to the present invention can also be used as a wiring as well as a barrier metal. In other words, the conductive thin film can be used for a case in which a high temperature thermal treatment is carried out as a post-treatment and a case in which a fine work to which is required. This is because the conductive thin film according to the present invention has enough heat resistance as well as capable of carrying out a fine work thereto.

The material(s) of the part(s) formed adjacent to the conductive thin film is not limited to specific kind(s) except when the thin film is used as a part of the electrode made of ferroelectrics and/or high dielectrics of the capacitor. Metals, metal oxides, silicon, poly-silicon, silicon-oxide, silicon-nitride, silicon-oxide-nitride and the like can be used for the materials of the parts formed adjacent to the conductive thin film.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of manufacturing a capacitor comprising the steps:
    forming an electrode which is composed by using a material containing a noble metal and is located on at least one side of a dielectric material composed by using at least one of a ferroelectric material and a high-dielectric material; and
    performing a patterning of the electrode by dry-etching with fluorine gas, wherein rhenium (Re) is added to the material of the electrode before the etching, such that the reactivity of the noble metal is increased and no formation of side walls occurs.

2. A method of manufacturing a capacitor comprising the steps:
    forming an electrode which is composed by using a material containing a noble metal and is located on at least one side of a dielectric material composed by using at least one of a ferroelectric material and a high-dielectric material; and
    performing a patterning of the electrode by dry-etching with chlorine gas, wherein rhenium (Re) is added to the material of the electrode before the etching such that the reactivity of the noble metal is increased and no formation of side walls occurs.

3. The method in accordance with claim 2, wherein the dry-etching is carried out while introducing an oxide gas.

4. A method of manufacturing a semiconductor device comprising the steps:
    locating a conductive thin film on a semiconductor substrate; and
    performing a patterning of the conductive thin film by dry-etching with fluorine gas, wherein the thin film is made by using a noble metal containing rhenium (Re) such that the reactivity of the noble metal is increased and no formation of side walls occurs.

5. A method of manufacturing a semiconductor device comprising the steps:
    locating a conductive thin film on a semiconductor substrate; and
    performing a patterning of the conductive thin film by dry-etching with chlorine gas, wherein the thin film is made by using a noble metal containing rhenium (Re) the reactivity of the noble metal is increased and no formation of side walls occurs.

6. The method in accordance with claim 5, wherein the dry-etching is carried out while introducing an oxide gas.

7. A method of manufacturing a capacitor comprising the steps:
    forming an electrode which is composed by using a material containing a noble metal and is located on at least one side of a dielectric material composed by using at least one of a ferroelectric material and a high-dielectric material; and
    performing a patterning of the electrode by dry-etching with halogen gas, wherein rhenium (Re) is added to the material of the electrode before the etching such that the reactivity of the noble metal is increased and no formation of side walls occurs.

8. A method of manufacturing a semiconductor device comprising the steps:
    locating a conductive thin film on a semiconductor substrate; and
    performing a patterning of the conductive thin film by dry-etching by the reaction with halogen gas or halogen compound, wherein the thin film is made by using a noble metal containing rhenium (Re) such that the reaction of the noble metal is increased and no formation of side walls occurs.

9. A method of claim 8 wherein the noble metal is platinum or iridium.

10. A method of claim 9 wherein the halogen is fluorine and the composition formed from the reaction with the noble metal is $Pt_xRe_{1-x}F_6$ or $Ir_xRe_{1-x}F_6$.

11. A method of manufacturing a capacitor comprising the steps of:

forming an electrode which is composed by using a material containing a noble metal and is located on at least one side of a dielectric material composed by using at least one of a ferroelectric material and a high-dielectric material; and performing a patterning of the electrode by dry-etching by a reaction with fluorine, wherein rhenium (Re) is added to the material of the electrode before the etching and forms a composition having a low boiling point by the reaction with fluorine such that the reactivity of the noble metal is increased and no formation of side walls occurs.

12. A method of manufacturing a capacitor comprising the steps of:

forming an electrode which is composed by using a material containing a noble metal and is located on at least one side of a dielectric material composed by using at least one of a ferroelectric material and a high-dielectric material; and performing a patterning of the electrode by dry-etching by a reaction with chlorine gas or chloride gas, wherein rhenium (Re) is added to the material of the electrode before the etching and forms a composition having a low boiling point by the reaction with chlorine of chloride gas such that the reactivity of the noble metal is increased and no formation of side walls occurs.

13. A method of manufacturing a capacitor comprising the steps of:

forming an electrode which is composed by using a material containing a noble metal and is located on at least one side of a dielectric material composed by using at least one of a ferroelectric material and a high-dielectric material; and performing a patterning of the electrode by dry-etching by a reaction with halogen gas or halogen compound gas, wherein rhenium (Re) is added to the material of the electrode before the etching and which forms a composition having a low boiling point by the reaction with halogen gas or halogen compound gas such that the reactivity of the noble metal is increased and no formation of side walls occurs.

* * * * *